US006040739A

United States Patent [19]

Wedeen et al.

[11] Patent Number: 6,040,739
[45] Date of Patent: Mar. 21, 2000

[54] WAVEGUIDE TO MICROSTRIP BACKSHORT WITH EXTERNAL SPRING COMPRESSION

[75] Inventors: Robert S. Wedeen, Manhattan Beach; Arthur J. Durham, Torrance; Matthew D. Ferris, Redondo Beach; G. Sam Dow, Rancho Palos Verdes, all of Calif.

[73] Assignee: TRW Inc., Redondo Beach, Calif.

[21] Appl. No.: 09/145,917

[22] Filed: Sep. 2, 1998

[51] Int. Cl.[7] .............................. H03F 1/00; H01P 5/107

[52] U.S. Cl. .............................. 330/66; 330/68; 330/286; 333/26

[58] Field of Search .......................... 333/26, 33; 330/66, 330/68, 286

[56] References Cited

U.S. PATENT DOCUMENTS 5,235,300 8/1993 Chan et al. ........................... 333/26 X
5,414,394 5/1995 Gamand et al. .......................... 333/26
5,770,981 6/1998 Koizumi et al. .......................... 333/26
5,912,598 6/1999 Stones et al. ............................. 333/26

*Primary Examiner*—Paul Gensler
*Attorney, Agent, or Firm*—Michael S. Yatsko; Ronald M. Goldman

[57] ABSTRACT

A new amplifier module construction enhances the manufacturer's ability to repetitively construct multiple copies of millimeter microwave amplifiers having performance characteristics that are consistent with one another, particularly in input VSWR ratio characteristic, and which performance characteristic do not significantly change following any necessary rework of the amplifier module, including any MMIC chip replacement. In this module, a waveguide to microstrip transition is formed of a backshort member that is separate from the metal base or cover and that backshort member is held pressed in place against the substrate by force exerted by the module's cover plate through a spring member against the exterior of the backshort member. The spring member is formed by a resilient compressible gasket.

23 Claims, 5 Drawing Sheets

WAVEGUIDE TO MICROSTRIP BACKSHORT WITH EXTERNAL SPRING COMPRESSION

FIELD OF THE INVENTION

This invention relates to semiconductor millimeter wave amplifiers, and, more particularly, to a new module housing or package construction that enhances manufacture of high power millimeter wave amplifiers by achieving greater consistency in performance amongst the amplifiers manufactured during a production run.

BACKGROUND

Millimeter wave ("MMW") amplifiers operate at very high frequencies, 28 Gigahertz and higher. They employ a monolithic microwave integrated circuit device or "MMIC" die or chip as the active element which produces millimeter wave signal amplification. The MMIC chip and its associated circuitry is housed in a container, including a base, a ceramic substrate, and a covering lid, referred to as a module, and together therewith constitutes the MMW amplifier.

The amplifier module includes a waveguide to microstrip transition or coupling, as variously termed, for coupling the microwave energy introduced into the module through a rectangular waveguide in the module's base or lid. It also contains another like transition for coupling the amplified microwave energy out through another rectangular waveguide, also in the module's base or lid.

The transition includes a probe located in the path of the waveguide and a microwave cavity positioned on one side of the probe that forms a short circuit termination for the waveguide located on the other side of that probe. The cavity defines a length of short circuited waveguide of a length of approximately one-quarter wavelength at the middle of the amplifier's frequency range of operation, about one-quarter centimeter (one-tenth of an inch) at 28 GHz. The probe connects to a microstrip that leads to the MMIC amplifier chip.

The foregoing relationship of the transition elements achieves maximum energy coupling between the probe and the waveguide. Selection of cavity size, probe size and positioning for the transition design is accomplished using conventional design criteria available in the technical literature. Essentially such a cavity is a metal walled cavity whose walls are the same size and rectangular shape as that of the input waveguide. Its closed back end wall, the short-circuit, faces the entry to the cavity and the end of the input waveguide. The back wall of the cavity serves as a short circuit to the end of the input waveguide, a short circuit at the back, hence, the denomination of that microwave cavity as a backshort.

The past practice by the assignee of the present invention was to form that microwave cavity as an integral part of the lid, by simply machining out a rectangular shaped hole about four tenths of an inch deep into the underside surface of the lid. The integrally formed cavity was positioned to lay over the waveguide end in the module base when the lid was put in place. A resilient compressible conductive gasket was placed between those edges and the underlying elements to account for any surface unevenness.

Amplifier modules constructed in that way were found to yield inconsistent performance. That is, one amplifier module produced in a production run yielded certain performance characteristics, and the next amplifier module produced in that production run, although containing seemingly identical parts and assembly techniques as the first, obtained significantly different, hence, inconsistent, results. Though straightforward, simple, and direct the foregoing structure necessarily contributed to that inconsistency. Although not visible to the eye, minute physical differences and changes caused significant changes to the electromagnetic properties of the amplifier module.

At a frequency of 28 Ghz, one wavelength measures just under one centimeter in length or slightly less than four-tenths of an inch. Although also physically small in size, unlike lower frequency apparatus, the physical dimensions of the MMIC chip and the associated transition and transmission line components are large relative to the wavelength of the operating frequency. As a consequence a small physical difference of an amplifier element, whether in geometry, size and/or dielectric thickness, can impact the electromagnetic characteristics of the amplifier module.

Although intended to be identical in construction, in the absolute sense each MMW device in a production run might differ in physically minute respects from others within the production run. Should the substrate be too easily compressed, a change in torque of the screws that fasten the lid could change the geometry, and hence the dielectric characteristic of the ceramic substrate, causing a change in performance between one amplifier and the next. Although the physical change is minute in the absolute sense, measured against the wavelength of the frequencies employed, which is only one centimeter at 28 GHz, the difference is significant. That difference results in a change in the coupling characteristic of the transition between the waveguide and the microstrip.

Accordingly, a principal object of the invention is to simplify and more efficiently manufacture microwave millimeter wave amplifiers and like devices.

A further object of the invention is to manufacture millimeter microwave amplifiers that produce consistent operating performance.

An still further object of the invention is to provide a new module construction for millimeter microwave amplifiers that more easily reproduces in quantity microwave amplifiers that are consistent in performance.

And an additional object of the invention is to provide a new and more effective backshort assembly for the waveguide-to-microstrip transition or coupling in a millimeter microwave module.

SUMMARY OF THE INVENTION

In accordance with the foregoing objects, the amplifier module includes a waveguide to microstrip transition formed of a backshort member that is separate from the metal base or cover. The backshort member is held pressed in place against a dielectric substrate with a spring force exerted against the backshort member by the module's rigid metal cover plate. A spring member, such as a resilient compressible gasket, produces that spring force. Located on the exterior of the backstop member, the spring member is compressed between the backshort member and the cover plate, creating the spring force. As an additional improvement, the substrate is formed of Duroid dielectric material.

The foregoing invention enhances the ability to repetitively construct multiple copies of millimeter microwave amplifier modules whose performance characteristics are consistent with one another, particularly in input VSWR ratio characteristic. Moreover, those performance characteristics do not significantly change following any necessary rework of the amplifier module, including replacement of the MMIC amplifier chip.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DESCRIPTION OF THE PREFERRED EMBODIMENTS

Figure 1:
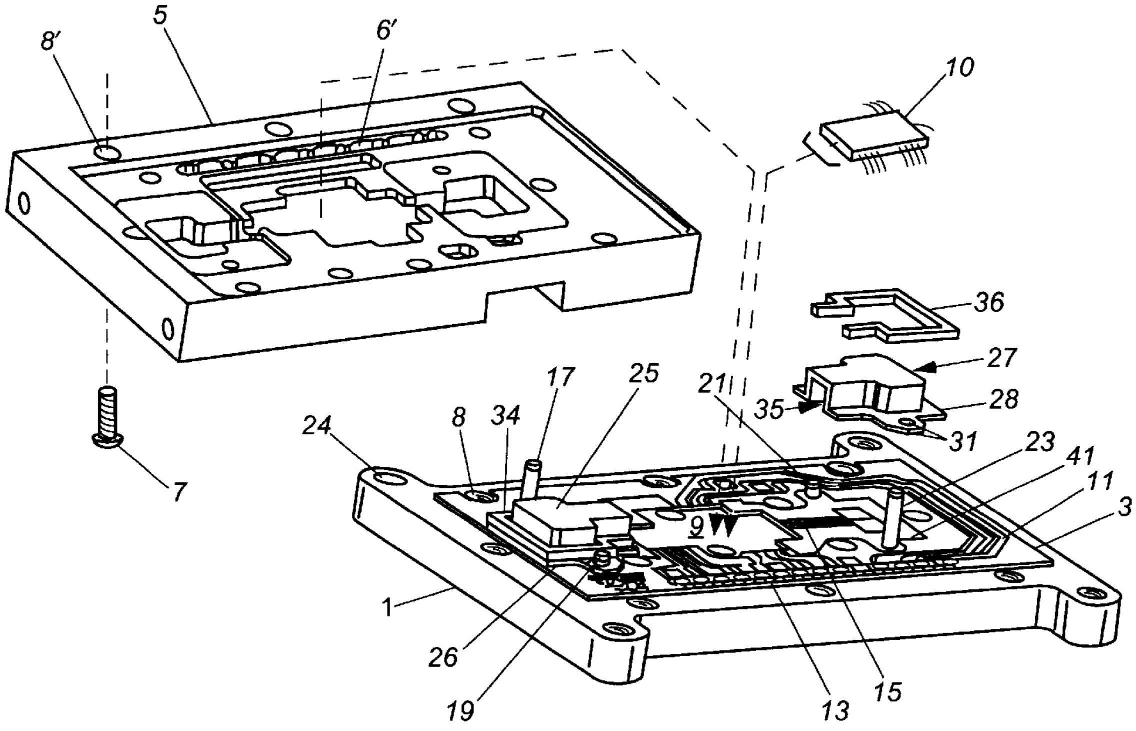
FIG. 1 is an exploded view of the MMW amplifier module.

A preferred embodiment of the MMW amplifier module is illustrated in a partially exploded view in FIG. 1 to which reference is made. The module includes a metal base plate 1, a dielectric substrate 3 that is permanently bonded to the base plate 1, containing the printed wiring and other plated metal traces, later herein described, and a metal cover or lid 5. When the module is assembled, lid 5 is secured to the base plate by fastening bolts 7, only one of which is illustrated. In a practical example of the invention, the metal used for base plate 1 and lid plate 5 is brass that has been plated over with a layer of nickel and gold to ensure high electrical conductivity and minimize corrosion.

A MMIC amplifier die or chip for the module is pictorially represented at 10. The chip is of conventional structure and includes bias leads extending from the right and left sides for connecting appropriate bias voltages thereto and RF input and RF output leads at the front and rear for respectively receiving microwave signals for amplification and outputting the amplified microwave signals.

Substrate 3 essentially covers a major portion of the upper surface of metal base plate 1, excluding the base's peripheral edges, the bolt holes and a mid-section area 9. The latter mid-section area 9 is a cutout, which is open, and provides a location to seat the MMIC die or chip 10 directly onto base plate 1. The open mid-section region 9 of substrate 3 allows access to the upper surface of metal base plate 1, when the substrate is bonded in place. MMIC chip 10 is bonded within that mid-section region directly to the exposed surface of base plate 1, suitably by non-electrically conductive epoxy.

The substrate is permanently bonded in place to the metal base plate with a conductive epoxy, as is the conventional practice. The substrate is a multi-layer one and is formed of Duroid dielectric material. It carries the metal traces 11, the plated-on wiring, for connecting MMIC chip 10 to the external DC bias supplies, and the connection pins 13 to those bias leads, which are neatly arranged in a row along the substrate's right edge as viewed in the figure. The electrical wires extending from the left and right sides of MMIC chip 10 are bonded to the corresponding electrical conductors on the substrate.

The substrate also contains the plated on wiring that forms the microstrip lines, such as microstrip line 15, the only such line visible in the figure, to which the MMIC chip's RF input and outputs are respectively connected, as later herein more fully described and illustrated.

Figure 2:
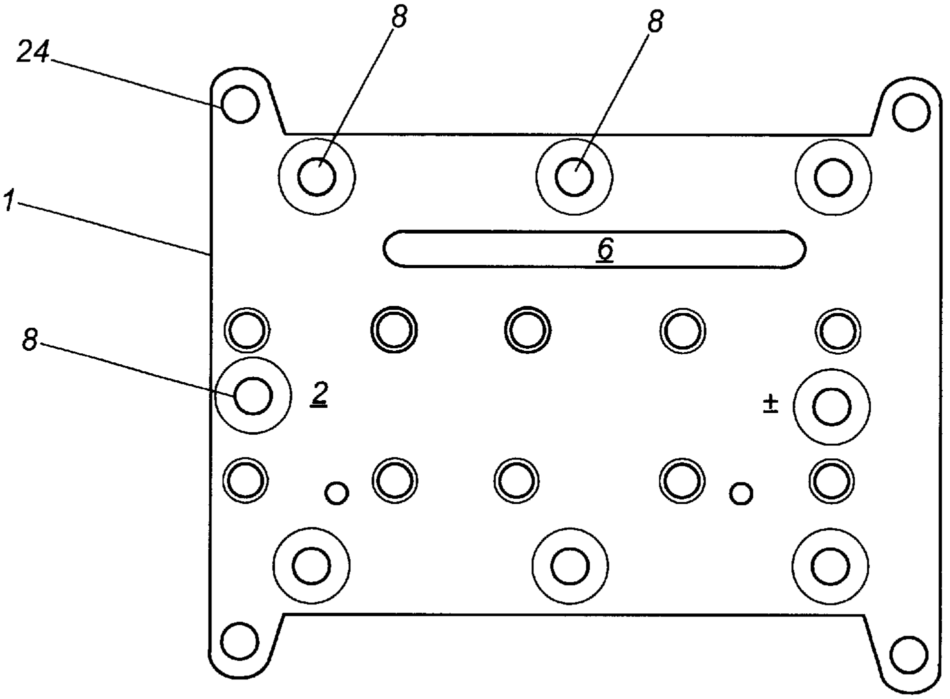
FIG. 2 is a bottom view of the base plate to the module of FIG. 1.
Figure 3:
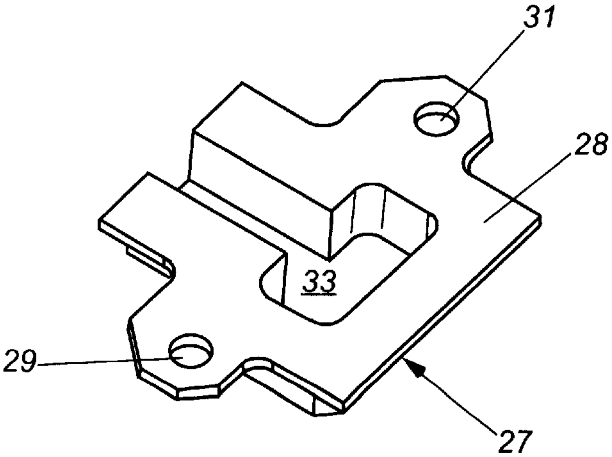
FIG. 3 illustrates a bottom perspective of the backshort member used in the embodiment of FIG. 1.
Figure 4:
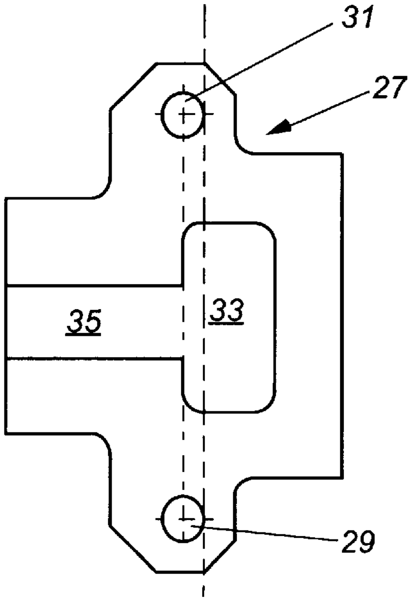
FIGS. 4, 5 and 6 show the backshort member of FIG. 3 in respective bottom, top and front views.

As shown in bottom plan view in FIG. 2, base plate 1 contains two rectangular passages 2 and 4, respectively located proximate the base plates left and right ends. Each passage extends between and through the base plate's upper and lower surfaces. Passage 2 serves as a rectangular input waveguide for externally applied microwave signals that are to be amplified in the module. Passage 4 serves as a rectangular output waveguide for the amplified microwave signal, whereby the amplified signal is coupled to external equipment. On the top side of the base plate, the two passages are covered by respective regions of dielectric material in substrate 3, which physically blocks the end of the respective passages, but permits the microwave energy to pass through. An elongate rectangular window 6 allows access through the base plate to the connecting contacts 13 from the substrate's bottom side.

Eight threaded bolt holes 8 are provided in the base plate, only three of which are numbered, for the fastening bolts 7, described in connection with FIG. 1. Cylindrical passages 45 and 46 (see FIG. 7) are provided to mount tool pins, later herein described. And the passages 24 located at the four corners of the base plate are provided for the bolts used to fasten the assembled amplifier module to an appropriate base or equipment rack.

Returning to FIG. 1, a small relatively rigid metal member 25, referred to herein as a backshort member, is seated on the substrate 3 at the left or input end of the module. Internally, that member contains a microwave cavity and an integral passage for a microstrip line, later herein more fully described. A second like backshort member 27, shown in exploded position, seats on the right or output end of substrate 3.

Both backshort members are identical in construction. The walls of the member are relatively thick to ensure that the member is relatively rigid in characteristic and does not easily flex or change in shape. Backshort member 25 is positioned on substrate 3 overlying the end of waveguide 2, shown in FIG. 2, while backshort member 27 is positioned over the end of waveguide 4 so that the backshort member's open bottom ends are aligned with the respective waveguide passages. The alignment is accomplished with tooling pins, later herein described.

Base plate 1 contains four tooling pins 17, 19, 21 and 23, which protrude vertically from the base plate through openings in substrate 3. Those pins are arranged in two pairs, one pair, pins 17 and 19, located at the left side of the module and associated with backshort 25, and the second pair, pins 21 and 23, located on the right side and associated with base plate 27. One of the pins in each pair is relatively short and the other long. Each pin extends through a corresponding hole through the substrate and is positioned within a ring frame metal section of substrate 3, later herein more fully described, and is soldered to that ring frame section.

Backshort member 27 contains a thin laterally outwardly extending flange 28 at the bottom end, which extends almost completely about the periphery of the raised portion of the member and seats flat against substrate 3. The flange 28 also contains two guide holes 29 and 31, only the latter of which is partially visible in this figure. Guide holes 29 and 31 fit over tooling pins 21 and 23, respectively. Those tooling pins guide the backshort member to its proper position on the substrate overlying the output waveguide end. The shorter tool pin 21 is just sufficient in length to pass through the backshort member's flange 28.

A like flange member 26 is integral to the other backshort member 25, shown seated to the left in the figure, and extends almost entirely about the bottom periphery of the backshort member, extending laterally outward from the bottom end of the member and lying flat against the subtrate 3. Flange 26 also includes a pair of guide holes, through which tooling pins 17 and 19 are shown protruding, the shorter of the two 19 just sufficient to extend through the flange. Additional structure to the backshort members is later herein described in connection with the illustration of those members presented in FIGS. 3 through 6.

It may be briefly noted at this point in the description that the distal end of each of the longer tooling pins 17 and 23 mates with a respective guide hole 52 and 54 formed in the bottom surface of lid 5, later herein described, thereby permitting the lid to be properly aligned on base plate 1.

A spring member, suitably a generally U-shaped resilient compressible gasket 34 seats upon flange 26 and collars backshort member 25. The gasket is a narrow strip of predetermined thickness arranged formed in an open U-shaped loop containing parallel extending stems bordering the opening, resembling a clip in appearance. The loop and stems are configured to conform to the geometry of the external surface of backshort member 25 and seat against the flange 26, while remaining clear of the guide holes in the flange's extremities. A like shaped resilient compressible gasket 36 is associated with backshort member 27. When assembled in place, gasket 36 fits on flange 28 and collars the outer surface of backshort member 27 above its flange 28, the same as gasket 34 collars backshort member 25.

Covering lid 5 is relatively thick and rigid. Its bottom surface is contoured essentially in a negative topographic relief image of substrate 3 and the other module components mounted atop base plate 1 and the substrate, as later herein described at greater length in connection with FIG. 8. It's upper surface, illustrated in FIG. 9, is essentially smooth, punctuated essentially by bolt holes 8', a connector window 6' and other miscellaneous holes, later herein described in greater detail.

The construction of the backshort members 25 and 27 is more clearly illustrated in the following figures. Reference is made to FIGS. 3, 4, 5 and 6 illustrating in greater scale backshort member 27 in bottom perspective, in bottom plan view, in top plan view, and in front view, respectively. As illustrated in the bottom perspective view of FIG. 3 and the bottom plan view of FIG. 4, backshort member 27 is formed of a single piece of metal. It contains a top wall, four side walls oriented in a rectangular configuration joined to that top wall, and an open bottom. Together those walls define the rectanguloid shaped microwave cavity 33. The rectangular shaped microwave cavity's open end functions as an exit or, in the case of the other like constructed backshort member, an entrance for TEOl rectangular mode microwave energy propagating, respectively, from or to the microwave cavity 33.

Backshort member 27 also contains three elongate walls defining a passage-way 35 of the same height as microwave cavity 33. The passage-way walls are integrally joined at one end to one of the aforementioned cavity side walls and opens into the cavity through a conforming sized opening in that cavity side wall. As shown in the front view of FIG. 6 the entrance to that passage-way 35 is also rectangular in shape and of the same height as the defined microwave cavity 33.

Figure 5:
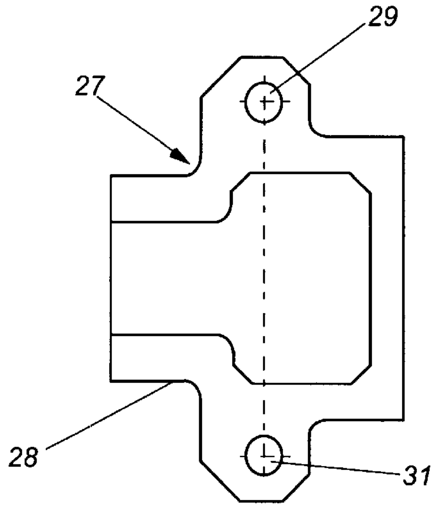
Figure 6:
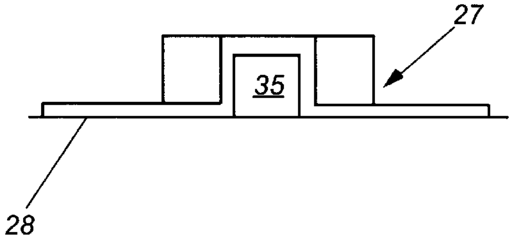

The top view of FIG. 5 shows flange 28 and the guide pin holes 29 and 31 on opposite right and left sides of the backstop member 27. The guide holes are formed in extended portions of the flange, thereby leaving a sufficiently wide annular rim portion between the guide hole and the side of the raised portion of the member that is to carry the associated U-shaped resilient gasket 36. The guide holes are sized and relatively positioned with respect to one another to the same tolerance used for the tooling pins associated therewith, suitable a tolerance of plus or minus two mils. As shown the flange 28 extends almost entirely about the periphery of the member, extending up to the front entrance to passage-way 35.

As briefly earlier described, the internal microwave cavity within the respective backshort members are positioned at regions of the substrate 3 that are dielectric in nature, a region not covered by a metal coating. Those regions are more clearly illustrated in a top view of substrate 3 presented in slightly larger scale in FIG. 7, to which reference is made.

The dielectric region for backshort member 27 is shown as a small rectangular area 40 on the right side of the figure; that associated with backshort member 25 is shown as rectangular area 38, to the left side of the figure. The size and geometry of dielectric region 40 is essentially identical to that size and geometry of the open end of microwave cavity 33 in backshort member 27 and to that of the waveguide 4 through base plate 1, which underlies that region.

A plated-on metal region, referred to as a ring frame 41, extends in an open loop almost entirely around the rectangular dielectric region 38, and helps defines said dielectric region. In size and geometry the ring frame is patterned after flange 28, and contains sideways extending regions with a pair of holes 45 for passage of the tooling pins, earlier referred to, projecting from base plate 1.

Stem extensions of the ring frame, located at the opening of that loop, extend in parallel to the left and there between further define an elongate rectangular passage 35' of dielectric material, extending from the open end of the formed loop laterally to the left to the cut-out region 9 in the substrate. That elongate rectangular passage, it should be noted falls within and serves as a bottom surface to passage 35 in backshort member 27. A portion of the ring frame 41 also extends alongside a portion of the cut-out region 9.

To the right, microstrip transmission line 15, electrically insulated from contact with other metal traces on the substrate, extends along the upper surface of substrate 3 from the right end of cut-out region 9 to the edge of the dielectric region 40. A probe 42, a strip of plated-on metal, connects to the right end of that microstrip line and extends into and partially across the rectangular dielectric region 40. During amplifier operation, probe 42 couples microwave energy propagating from the microstrip line 15 into the waveguide cavity and excites a rectangular TE01 mode that propagates through waveguide 4.

On the left hand side of the board, another like ring frame 39, another plated-on metal region patterned after flange 26 on backshort member 25, extends in a loop almost entirely around the other rectangular dielectric region 38, associated with the internal microwave cavity in backshort member 25 and input waveguide 2 in the base plate. Sideways extending portions of the ring frame contain a pair of holes 46 for the tooling pins, earlier referred to, projecting from base plate 1. Stem ends to that ring frame located about the open end of the formed loop, extend to the right. Those stems also define an elongate laterally rectangular passage 37' of dielectric material, extending from the opening in the formed loop to the center cutout region 9, to the left. The stem ends to that ring frame 39 also extends alongside a portion of the cut-out region 9.

Microstrip transmission line 14, of the same construction as line 15, is disposed in insulated relationship in the formed passage 37, extending from an edge of dielectric region 38 to the left edge of the cut out region 9 in the substrate. Another probe 44, identical in construction to probe 42, is connected to the left or input end of microstrip line 14 and extends partially across the rectangular dielectric region 38. During amplifier operation, probe 44 couples rectangular mode TE01 microwave energy propagating into the internal microwave cavity in backshort member 25 into the microstrip line 14 as TEM mode, which propagates along that transmission line.

As visible in this view, microstrip lines 14 and 15 are not simple straight conductors but incorporate changes in width and are associated with conductive spots adjacent the main conductor, which are recognized by those skilled in the art as conventional means to tune or "tweak" the electronic characteristics of the line to ensure that the lines are sufficiently broad-band in characteristic over the band of frequencies for which the amplifier is designed to operate.

Referring back to FIG. 1, it is seen that the flange 28 of backshort member 27 abutts ring frame member 41, when the backshort is lowered into position on substrate 3, the internal microwave cavity in that member overlies probe 42, and that the laterally extending passage way 35 in the backstop member overlies and partially surrounds microstrip transmission line 33 and extends to the right edge of cutout region 9 in substrate 3.

The same relationship is defined between backshort member 25, its internal microwave cavity, laterally extending passage, microstrip line 14 and probe 44.

With MMIC chip 10 bonded to base plate 1, the MMIC chip's RF output lead is soldered or bonded to the input end of microstrip transmission line 15 and its RF input lead is soldered or bonded to the output end of microstrip transmission line 14, not visible in FIG. 1, covered by backshort member 25.

Reference is again made to FIG. 7 and ring frames 39, 41 and 43 therein. With substrate 3 attached to base plate 1, the ring frames are placed at electrical ground potential by an electrical connection to metal substrate 1. Ring frames 39 and 41 thus serve as a portion of an extended waveguide whose walls are grounded. Portions of those ring frames and ring frame 43 also serve a portion of a shield about the sides of MIMIC chip 10. As illustrated, a large number of individual metal vias 47, only a few of which are numbered, represented as small circles, are disposed throughout the regions covered by the ring frames 39, 41 and 43. Those vias extend from those metal members, through the substrate 3, down to the substrate's underside. As assembled, with the substrate 3 bonded to base plate 1 with electrically conductive epoxy, those vias are all connected to electrical ground potential at base plate 1. In that way, the exposed dielectric regions 38 and 40 are bounded by electrically grounded metal walls that effectively extend through the thickness of the dielectric substrate. Likewise the portions of the ring frames and ring frame 43, which cover gaps along the sides of cutout region 9, serve as portions of an electrically grounded wall along the sides of the MMIC chip 10.

The substrate's various plated on bias conductors 11 extend from a pin contact junction 13 along a side edge of the substrate where they are respectively aligned in a row over various routes to various locations on opposite sides of cut out region 9, where they may be connected to the associated bias input leads on the MMIC chip, suitably by soldering or wire bonding.

Figure 8:
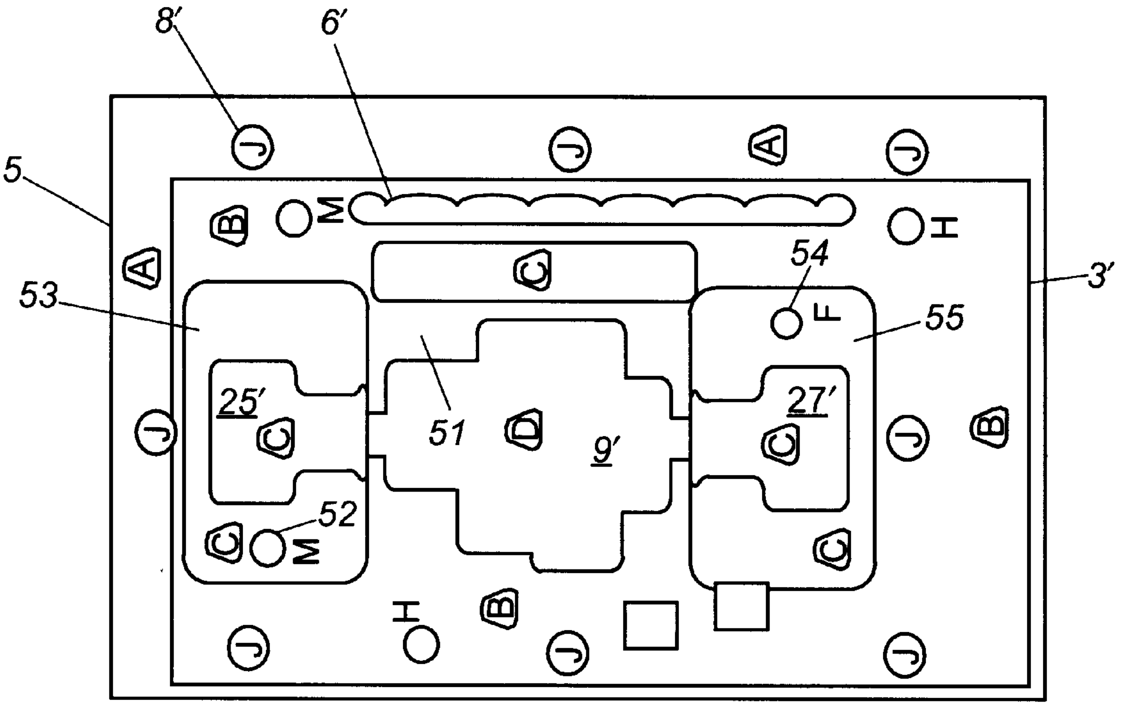
FIG. 8 illustrates a bottom view of the metal cover plate used in the module of FIG. 1.
Figure 9:
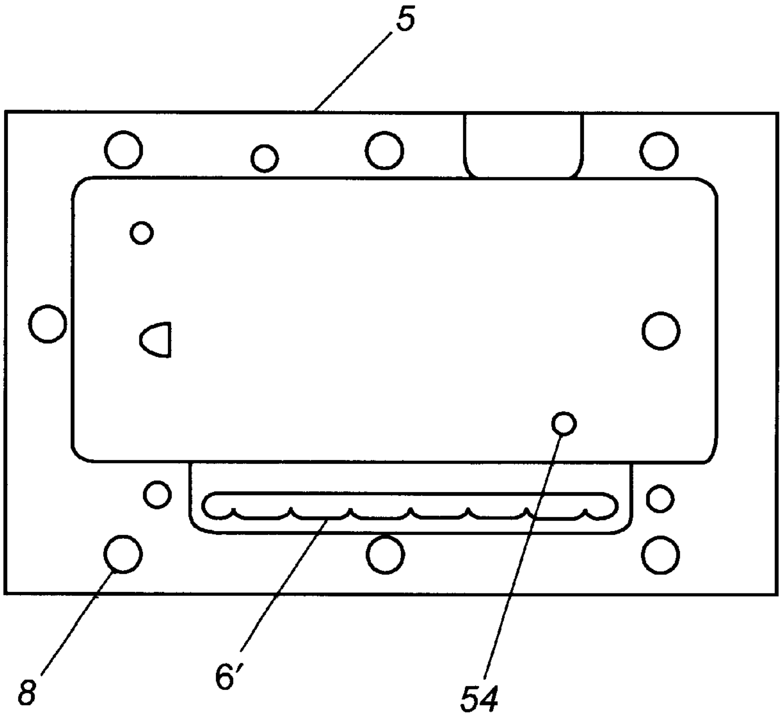
FIG. 9 shows a top elevation of the metal cover plate of FIG. 8.

A top plan view of th e inside surface of lid 5 is presented in FIG. 8. The metal lid is quite thick, relative to the thickness of the components mounted to the base and, hence, relatively rigid. Its inside surface contains various portions that are recessed from the cover plate's outer bottom edges to various degrees as hereafter discussed and, mechanically, appears shaped in the negative of a full-scale topographic relief map of the substrate, and the backshorts, gaskets and MMIC chips as positioned on the metal base and/or substrate, but with that surface relief being slightly greater to allow a clearance between the cover and the recited elements when the cover is fastened in place, and with the surf ace relief of the gasket is being shorter in height than the gasket's true height, between fifteen to twenty-five percent shorter.

As illustrated, the inside surface is machined out in a large rectangular area 3', corresponding to the outer area of substrate 3 and is slightly greater in depth than the thickness of the substrate. Within that region, another recessed cavity portion 9' extends deeper within the lid, to a slightly greater depth than the height of the MMIC chip 10. That portion is bordered by a more shallow border region 51. That recessed portion 9' is patterned after the cutout region 9 in substrate 3, which the more shallow border region serves as side walls to that region and is intended to make contact with the stem portions of the ring frames 47 and 41 and 43, illustrated in FIG. 7, that are located about the sides of the cut out region 9 on the substrate. Region 9' in the cover lid thus serves as a "mouse hole" for the MMIC chip, shielding the chip to prevent external microwave signals, interference, from accessing the MMIC chip in an undesired manner and, conversely, preventing radiation from the chip's output from exiting through a path other than via the output microstrip line 15.

A third and fourth region 53 and 55 are recessed to a depth that is about fifteen to twenty per cent less, respectively, than the total height of the flange 26 and resilient compression member 34 and flange 28 and resilient compression member 36, illustrated in FIG. 1.

Region 55 partially surrounds another more deeply recessed region 27' that is formed to a depth greater than the height of the central section of backshort 27 as seated on substrate 3 and is of an area patterned upon that central section, illustrated earlier in the top view of FIG. 5. And region 53 partially surrounds another more deeply recessed region 25' that is formed to a depth greater than the height of the central section of backshort 25 as seated on substrate 3.

Lid 5 also contains two tool pin guide holes. Guide hole 52, located in recessed region 53, and guide hole 54, located in recessed region 55, respectively receive tool pins 17 and 23, earlier illustrated in FIG. 1. The pin and guide hole arrangement permits lid 5 to be correctly aligned when being assembled onto base plate 1. The cut out region or window 6' is included in the lid to allow access to the row of pin contacts on the substrate 3.

Returning to FIG. 1, assuming substrate 3 is bonded in place on top of metal base plate 1 as shown, and that MMIC chip 10 is bonded in place in the mid-region cut out 9 in the substrate to the upper surface of base plate 1, the backshort members 25 and 27 are respectively placed on the substrate with the respective guide holes engaging the respective tool pins 17 and 19 and 21 and 23. Resilient compression members 34 and 36 are then placed in position over the flanges of the respective backshorts. Lid 5 is then placed thereover, orienting the guide holes 52 and 54 onto the respective longer tool pins 17 and 23. As so properly aligned by the tool pins, lid 5 is pressed down against baseplate 1 and fastened thereto, with the peripheral edge of the upper surface of base plate 1 compressively engaging the bottom peripheral edges of the lid, by inserting and tightening the connecting bolts 7 into the respective treaded holes 8.

Accordingly, when the covering lid 5 is fastened in place, that portion of the lids surface relief overlying the gaskets 34 and 36 presses against and compresses the gasket, which in turn places a compressive force on the associated backshort member through the backshort member's flange.

Figure 10:
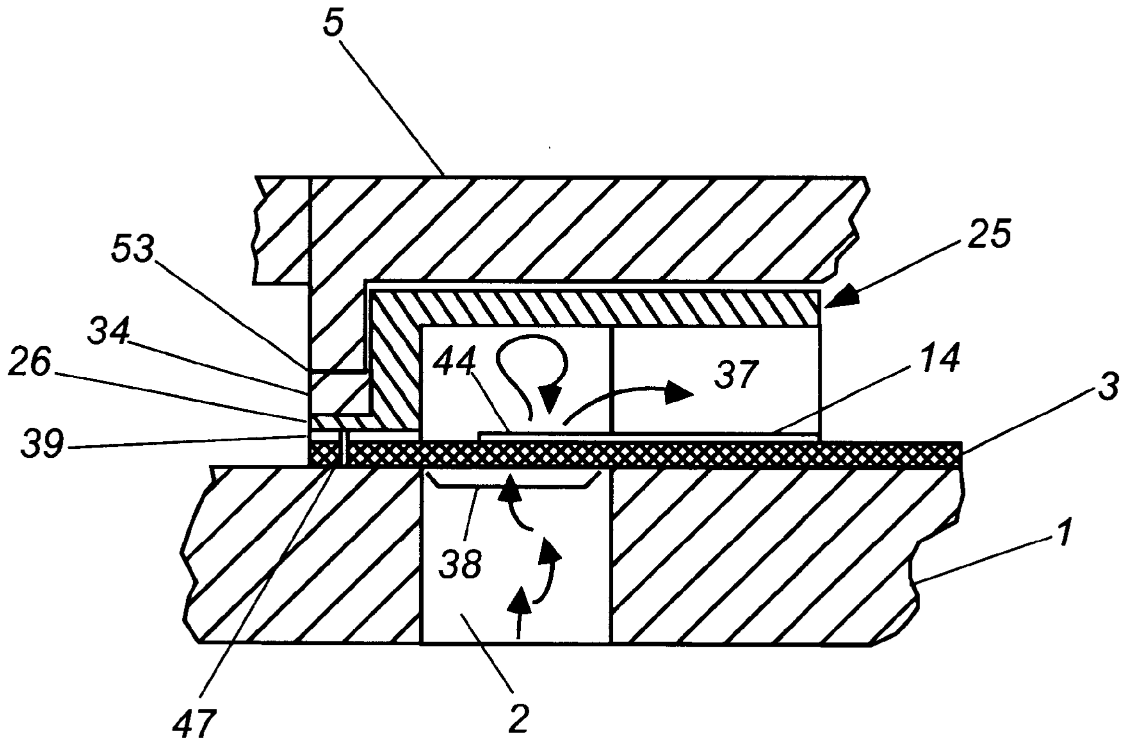
FIG. 10 is a side section view of a portion of the assembled amplifier module of FIG. 1.

The foregoing assembled relationship is illustrated in the partial section view of the amplifier module as assembled in FIG. 10, showing the pertinent elements. The lid 5's internal relief 53 compresses resilient gasket 34 against flange 26, pressing the flange against the ring frame 39, the latter of which is electrically grounded through vias 47 to and in contact with metal base 1, and holds the backshort member 25 in place. The backshort member is held in place with its entrance aligned with the underlying input waveguide 2 and is also aligned with the rectangular dielectric region 38 on substrate 3 and with the probe 44 carried on that substrate, properly positioned in the waveguide.

In operation with appropriate DC bias voltages connected via the pin connectors on the substrate, microwave energy in the rectangular or TE01 mode inputted to the amplifier module through waveguide 2 is coupled from the rectangular waveguide into the internal microwave cavity and, thereby, couples to probe 44 in the microstrip or TEM mode. From probe 44, the microwave energy is coupled to microstrip line 14. The microwave energy propagates along microstrip line 14 and couples to the input of the MMIC chip 10 via a chip lead, not illustrated, that is connected to microstrip line 14 at the exit to sideways extending passage 37'.

Figure 7:
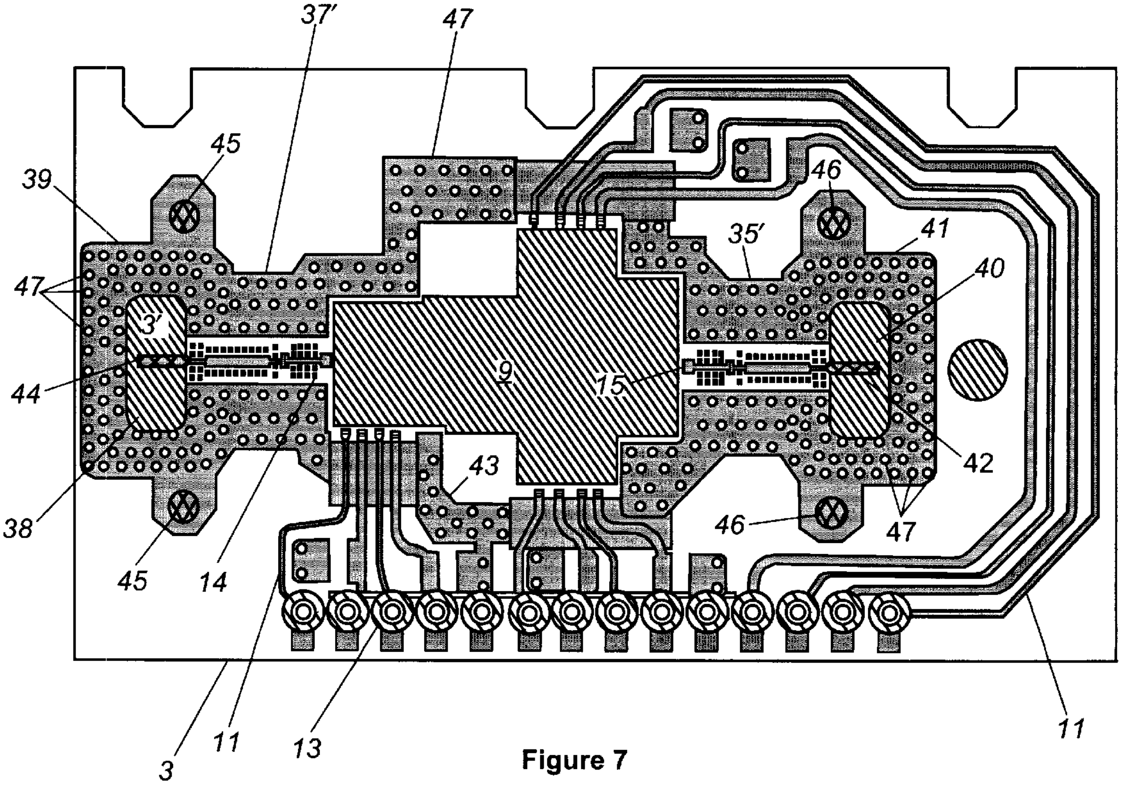
FIG. 7 illustrates a top view of the MIMIC chip substrate that is bonded to the base plate in the MMW amplifier module of FIG. 1.

The MMIC chip amplifies that microwave energy and the amplified microwave energy is output from the MMIC chip through an output lead and coupled to an end of the output microstrip line 15 and probe 42 shown in FIG. 7. The modules corresponding output elements are assembled in a mirror image of the elements of FIG. 10. In that output coupling, the microwave energy on the output probe 42 is coupled into the internal microwave cavity in the output backshort member and excites a rectangular mode which propagates through output waveguide 4.

Press fitting the foregoing backshort members in place, eliminates the need to do so, as example, with solder or with epoxy. A press fit is more convenient than solder. When flowing, solder is able to flow into vias, which is not desired; and any solder spillage in the cavity, however minute, could affect microwave performance characteristics of the amplifier, also not desirable. The same holds true for conductive epoxy. It also makes the unit easier to rework if further development is needed. Thus although the foregoing structure is mechanical in nature, its benefit is electronic.

As earlier noted, substrate 3 is preferably constructed of a laminate of layers of Duroid insulator material on which the plated on conductors and vias are formed using conventional plating technique. Duroid insulator material is well known and is one of many alternative materials available at substrate manufacturers. It is believed to be a polychorofluoro-tetra-ethylene composition, like the more familiar "TEFLON" material. Since the Duroid material is a dielectric, it is pervious to microwave energy, and that energy is able to easily propagate through the material. That characteristic permits a region of the substrate, not covered by metal, to be positioned over and cover the input waveguide end, and output waveguide end, in front of the backstop entrance, without adverse effect. It also is less brittle and less rigid and more compressible in character than aluminum oxide or other ceramic materials typically used as substrates for MMIC chips. Hence, when pressure is exerted to force the backshort members against the substrate, the substrate does not crack, chip or leave minute gaps between the outer edges of the backstop members and the substrate surface. The appearance of cracks, ceramic chips or gaps in one amplifier module could affect the amplifier's electronic performance characteristics and make that performance inconsistent with that obtained in another seemingly identical amplifier module. Avoidance of those effects is believed to contribute to obtaining consistency in electronic performance, and, hence, reproduceability of the amplifier module.

As described, gaskets 34 and 36 are essentially spring members. Each gasket is formed of a resilient compressible material, which, optionally, may be electrically conductive, such as that marketed under the brand name CONSIL-C from Tecknit company of Cranford, N.J. Other resilient compressive gasket material may of course be substituted for the foregoing without departing from the invention. Ideally the material should compress to one-half of its initial thickness when subjected to a maximum compressing force. For the present invention a nominal compression of fifteen to twenty-five percent of the nominal thickness appears sufficient. Although less preferred a metal spring may be substituted for the resilient gasket. One such spring can be formed of spring steel shaped essentially as a collar, and contains a wave-like shape in the unstressed condition. Such metal spring is less preferred, since it cannot as readily seal all gaps.

Amplifier modules are intended to amplify microwave frequencies over a range or band of frequencies centered at a given frequency, 28 GigaHz in the example given. An important characteristic of the amplifier module is its input impedance. The module is designed so that at the principal frequency the input impedance should appear as close as possible to a resistance and thereby closely match the impedance of the external transmission lines that feed into the input waveguide. That input characteristic is measured as a voltage standing wave ratio, VSWR. If exactly matched in impedance that VSWR should be measured as a value of 1.0, when measured at that center frequency. Ideally, the VSWR at other frequencies within the band, should also be one, or, more realistically, not exceed a specified value, such as 1.2.

When changing the frequencies and measuring the VSWR each time, the results may be depicted graphically yielding a curve of VSWR as taken against frequency. Alternatively, one may measure and plot the return loss which, being related to the VSWR, will vary somewhat with frequency. The higher the return loss, the more power that is coupled to the load, which is desireable. A return loss of about 20 db is generally considered good. When a second amplifier is constructed, it should obtain almost identical results to that obtained in the first. However, if by chance, a minute almost imperceptible drop of solder or epoxy is inadvertently dropped onto the area of the substrate in the waveguide or alongside the microstrip transmission lines, or should the substrate crack, changing its dielectric characteristic slightly, such will introduce a frequency sensitive electrical effect into the amplifier, and, the VSWR curve obtained from the second amplifier will not be the same as that from the first. This is a performance inconsistency. In practical embodiments constructed in accordance with the foregoing invention, it was found that the performance characteristics obtained were consistent.

It is believed that the foregoing description of the preferred embodiment of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A millimeter microwave amplifier module assembly, comprising:

a metal base plate, said base plate having an upper surface and a lower surface, and being of a predetermined thickness and relatively rigid in characteristic;

said metal base plate including first and second rectangular waveguide passages, said passages being spaced apart and extending between and through said upper and lower surfaces to permit propagation of rectangular mode microwave energy;

said first and second rectangular waveguide passages comprising a rectangular cross section geometry;

first and second tooling pins, said first and second tooling pins being mounted to said base plate on opposite sides of said first waveguide passage and extending from and oriented perpendicular to said upper surface;

said first tooling pin being of a first length and said second tooling pin being of a second length, and said second length being greater than said first length;

third and fourth tooling pins, said third and fourth tooling pins being mounted to said base plate on opposite sides of said second waveguide passage and extending from and oriented perpendicular to said upper surface;

said third tooling pin being of said first length and said fourth tooling pin being of said second length;

a substrate of dielectric material bonded to said upper surface of said base plate, said substrate including a first rectangular dielectric region covering an end of said first rectangular waveguide passage and a second rectangular dielectric region covering an end of said second rectangular waveguide passage, said substrate being of a predetermined thickness and including guide holes for receiving there through said first, second, third and fourth tooling pins;

a first metal ring frame attached to said upper surface of said substrate; said first metal ring frame extending about the periphery of said first rectangular dielectric region and containing a passage there through;

a first plurality of electrical vias, said first plurality of electrical vias extending from said first metal ring frame through said substrate for electrical contact with said metal base plate;

a second metal ring frame attached to said upper surface of said substrate; said second metal ring frame extending about the periphery of said second rectangular dielectric region and containing a passage there through;

a second plurality of electrical vias, said second plurality of electrical vias extending from said second metal ring frame through said substrate for electrical contact with said metal base plate;

a first microstrip transmission line and a second microstrip transmission line attached an upper surface of said substrate;

said first microstrip transmission line extending through said passage in said first metal ring frame to said first rectangular dielectric region, said first microstrip transmission line being electrically insulated from said first metal ring frame, and said second microstrip transmission line extending through said passage in said second metal ring frame to said second rectangular dielectric region, said second microstrip transmission line being electrically insulated from said second metal ring frame;

a first coupling probe attached to said upper surface of said substrate; said first coupling probe extending into said first rectangular dielectric region and having an end connected to said first microstrip transmission line for coupling microwave energy to said first microstrip transmission line;

a second coupling probe attached to said upper surface of said substrate; said second coupling probe extending into said second rectangular dielectric region and having an end connected to said second microstrip transmission line for coupling microwave energy to said second microstrip transmission line;

a first metal backshort member for said first rectangular waveguide passage;

said first metal backshort member including an exterior surface containing a rectanguloid shaped portion and a flange laterally extending therefrom and extending about a bottom end of said rectanguloid shaped portion, said flange thereof having a predetermined flange thickness;

said flange thereof including first and second guide holes for respectively receiving there through said first and second tooling pins;

said first metal backshort member further including an interior surface defining a metal walled rectangular microwave cavity having a rectangular cross-section geometry congruent with said cross-section geometry of said first rectangular waveguide passage and having an open front wall;

said first metal backshort member further including a bottom end defining a frame to said open front wall of said microwave cavity;

said first metal backshort member further defining a metal walled lateral passage leading from the exterior of said first metal backshort member through said frame and a side wall of said microwave cavity into said microwave cavity, said metal walled lateral passage being oriented perpendicular to said side wall of said microwave cavity and being open on a bottom side;

said first metal backshort member being positioned on said dielectric substrate with said bottom end of said first metal backshort member abutting said first ring frame and said open front wall of said microwave cavity therein oriented facing and in alignment with said first rectangular dielectric region; and with said metal walled lateral passage thereof overlying said passage through said first ring frame;

a first resilient compressible gasket; said first resilient compressible gasket being of a predetermined height and width and defining a U-shaped portion to fit on said flange of said first metal backshort member and collar said rectanguloid portion thereof;

a second metal backshort member for said second rectangular waveguide passage;

said second metal backshort member including an exterior surface containing a rectanguloid shaped portion and a flange laterally extending therefrom and extending about a bottom end of said rectanguloid shaped portion thereof, said flange thereof being of said predetermined flange thickness;

said flange thereof including third and fourth guide holes for respectively receiving there through said third and fourth tooling pins;

said second metal backshort member further including an interior surface defining a metal walled rectangular microwave cavity having a rectangular cross-section geometry congruent with said cross-section geometry of said second rectangular waveguide passage and having an open front wall;

said second metal backshort member further including a bottom end defining a frame to said open front wall of said microwave cavity thereof;

said second metal backshort member further defining a metal walled lateral passage leading from the exterior of said second metal backshort member through said frame and a side wall of said microwave cavity thereof into said microwave cavity, said metal walled lateral passage being oriented perpendicular to said side wall of said microwave cavity and being open on a bottom side;

said first metal backshort member being positioned on said dielectric substrate with said bottom end of said backshort abutting said second ring frame and said open front wall of said microwave cavity therein oriented facing and in alignment with said second rectangular dielectric region; and with said metal walled lateral passage thereof overlying said passage through said second ring frame;

a second resilient compressible gasket; said second resilient compressible gasket being of said predetermined height and width and defining a U-shaped portion to fit on said flange of said second backshort member and collar said rectanguloid portion thereof;

a metal cover plate for attachment to said metal base plate; said metal cover plate including a top side and a bottom side, said cover plate being relatively rigid and having a predetermined thickness;

said cover plate including a pair of guide holes for receiving therewithin respective ones of said second and fourth tooling pins;

said bottom side of said cover plate including a peripheral edge portion and bounding a first recessed portion, recessed from said bottom end, to fit over said substrate, wherein said peripheral edge portion contacts said metal base plate and said upper surface of said substrate is received within said recessed portion without contact between said cover plate and said first and second microstrip transmission lines when said cover plate is attached to said metal base plate;

said bottom side of said cover plate including a second recessed area located within said first recessed area for receiving there within said rectanguloid portion of said exterior surface of said first metal backshort member, said second recessed area being further recessed from said bottom than said first recessed area;

said bottom side of said cover plate including a third recessed area located within said first recessed area for receiving there within said rectanguloid portion of said exterior surface of said second metal backshort member, said third recessed area being further recessed from said bottom than said first recessed area;

said bottom side of said cover plate including a fourth recessed area located within said first recessed area and contiguous to said second recessed area for receiving there within said first resilient compressible gasket, said fourth recessed area being further recessed from said bottom than said first recessed area and less recessed therefrom than said second recessed area;

said fourth recessed area being of a depth from said bottom end that is less than the combined height of said first resilient compressible gasket, said flange of said first metal backshort member and said substrate;

said bottom side of said cover plate including a fifth recessed area located within said first recessed area and contiguous to said third recessed area for receiving there within said second resilient compressible gasket, said fifth recessed area being further recessed from said bottom than said first recessed area and less recessed therefrom than said third recessed area;

said fifth recessed area being of a depth from said bottom end that is less than the combined height of said second resilient compressible gasket, said flange of said second metal backshort member and said substrate;

whereby said cover plate compresses said first and second resilient compressible gaskets against said respective flange of said first and second backshort members when said cover plate is fastened to said metal base plate to press said first and second backshort members against said respective first and second ring frames.

2. The invention as defined in claim 1, wherein said substrate further includes a wide central opening therethrough to provide access to a portion of said upper surface of said metal base plate;

a MMIC amplifier chip, said MMIC amplifier chip being located within said wide central opening and being bonded therewithin to said upper surface of said metal base plate;

said MMIC amplifier chip including an input for receiving microwave energy and an output for outputting amplified microwave energy;

said input being connected to said first microstrip line and said output being connected to said second microstrip line; and wherein said first side of said cover plate further includes:

a sixth recessed area located within said first recessed area for receiving therewithin said MMIC amplifier chip, said sixth recessed area being further recessed from said bottom end than said first recessed area.

3. A millimeter microwave amplifier module assembly, comprising:

a metal base plate, said base plate having an upper surface and a lower surface, and being of a predetermined thickness and relatively rigid in characteristic;

said metal base plate including first and second rectangular waveguide passages, said passages being spaced apart and extending between and through said upper and lower surfaces to permit propagation of rectangular mode microwave energy;

said first and second rectangular waveguide passages comprising a rectangular cross section geometry;

a substrate of dielectric material bonded to said upper surface of said base plate and including a first rectangular dielectric region covering an end of said first rectangular waveguide passage and a second rectangular dielectric region covering an end of said second rectangular waveguide passage, said substrate being of a predetermined thickness;

a first metal ring frame attached to said upper surface of said substrate; said first metal ring frame extending about the periphery of said first rectangular dielectric region and containing a passage there through;

a first plurality of electrical vias, said first plurality of electrical vias extending from said first metal ring frame through said substrate for electrical contact with said metal base plate;

a second metal ring frame attached to said upper surface of said substrate; said second metal ring frame extending about the periphery of said second rectangular dielectric region and containing a passage there through;

a second plurality of electrical vias, said second plurality of electrical vias extending from said second metal ring frame through said substrate for electrical contact with said metal base plate;

a first microstrip transmission line and a second microstrip transmission line attached an upper surface of said substrate;

said first microstrip transmission line extending through said passage in said first metal ring frame to said first rectangular dielectric region, said first microstrip transmission line being electrically insulated from said first metal ring frame, and said second microstrip transmission line extending through said passage in said second metal ring frame to said second rectangular dielectric region, said second microstrip transmission line being electrically insulated from said second metal ring frame;

a first coupling probe attached to said upper surface of said substrate; said first coupling probe extending into said first rectangular dielectric region and having an end connected to said first microstrip transmission line for coupling microwave energy to said first microstrip transmission line;

a second coupling probe attached to said upper surface of said substrate; said second coupling probe extending into said second rectangular dielectric region and having an end connected to said second microstrip transmission line for coupling microwave energy to said second microstrip transmission line;

a first metal backshort member for said first rectangular waveguide passage;

said first metal backshort member including an exterior surface containing a rectanguloid shaped portion and a flange laterally extending therefrom and extending about a bottom end of said rectanguloid shaped portion, said flange thereof having a predetermined flange thickness;

said first metal backshort member further including an interior surface defining a metal walled rectangular microwave cavity having a rectangular cross-section geometry congruent with said cross-section geometry of said first rectangular waveguide passage and having an open front wall;

said first metal backshort member having a bottom end defining a frame to said open front wall of said microwave cavity;

said first metal backshort member further defining a metal walled lateral passage leading from the exterior of said first metal backshort member through said frame and a side wall of said microwave cavity into said microwave cavity, said metal walled lateral passage being oriented perpendicular to said side wall of said microwave cavity and being open on a bottom side;

said first metal backshort member being positioned on said dielectric substrate with said bottom end of said first metal backshort member abutting said first ring frame and said open front wall of said microwave cavity therein oriented facing and in alignment with said first rectangular dielectric region; and with said metal walled lateral passage thereof overlying said passage through said first ring frame;

a first resilient compressible gasket; said first resilient compressible gasket being of a predetermined height and width and defining a U-shaped portion to fit on said flange of said first metal backshort member and collar said rectanguloid portion thereof;

a second metal backshort member for said second rectangular waveguide passage;

said second metal backshort member including an exterior surface containing a rectanguloid shaped portion and a flange laterally extending therefrom and extending about a bottom end of said rectanguloid shaped portion thereof, said flange thereof being of said predetermined flange thickness;

said second metal backshort member further including an interior surface defining a metal walled rectangular microwave cavity having a rectangular cross-section geometry congruent with said cross-section geometry of said second rectangular waveguide passage and having an open front wall;

said second metal backshort member having a bottom end defining a frame to said open front wall of said microwave cavity thereof;

said second metal backshort member further defining a metal walled lateral passage leading from the exterior of said second metal backshort member through said frame and a side wall of said microwave cavity thereof into said microwave cavity, said metal walled lateral passage being oriented perpendicular to said side wall of said microwave cavity and being open on a bottom side;

said first metal backshort member being positioned on said dielectric substrate with said bottom end of said backshort abutting said second ring frame and said open front wall of said microwave cavity therein oriented facing and in alignment with said second rectangular dielectric region; and with said metal walled lateral passage thereof overlying said passage through said second ring frame;

a second resilient compressible gasket; said second resilient compressible gasket being of said predetermined height and width and defining a U-shaped portion to fit on said flange of said second backshort member and collar said rectanguloid portion thereof;

a metal cover plate for attachment to said metal base plate; said metal cover plate including a top side and a bottom side, said cover plate being relatively rigid and having a predetermined thickness;

said bottom side of said cover plate including a peripheral edge portion and bounding a first recessed portion, recessed from said bottom end, to fit over said substrate, wherein said peripheral edge portion contacts said metal base plate and said upper surface of said substrate is received within said recessed portion without contact between said cover plate and said first and second microstrip transmission lines when said cover plate is attached to said metal base plate;

said bottom side of said cover plate including a second recessed area located within said first recessed area for receiving there within said rectanguloid portion of said exterior surface of said first metal backshort member, said second recessed area being further recessed from said bottom than said first recessed area;

said bottom side of said cover plate including a third recessed area located within said first recessed area for receiving there within said rectanguloid portion of said exterior surface of said second metal backshort member, said third recessed area being further recessed from said bottom than said first recessed area;

said bottom side of said cover plate including a fourth recessed area located within said first recessed area and contiguous to said second recessed area for receiving there within said first resilient compressible gasket, said fourth recessed area being further recessed from said bottom than said first recessed area and less recessed therefrom than said second recessed area;

said fourth recessed area being of a depth from said bottom end that is less than the combined height of said first resilient compressible gasket, said flange of said first metal backshort member and said substrate;

said bottom side of said cover plate including a fifth recessed area located within said first recessed area and contiguous to said third recessed area for receiving there within said second resilient compressible gasket, said fifth recessed area being further recessed from said bottom than said first recessed area and less recessed therefrom than said third recessed area;

said fifth recessed area being of a depth from said bottom end that is less than the combined height of said second resilient compressible gasket, said flange of said second metal backshort member and said substrate;

whereby said cover plate compresses said first and second resilient compressible gaskets against said respective flange of said first and second backshort members when said cover plate is fastened to said metal base plate to press said first and second backshort members against said respective first and second ring frames.

4. A millimeter microwave amplifier module assembly, comprising:

a metal base plate, said base plate having an upper surface and a lower surface, and being of a predetermined thickness and relatively rigid in characteristic;

said metal base plate including first and second rectangular waveguide passages, said passages being spaced apart and extending between and through said upper and lower surfaces to permit propagation of rectangular mode microwave energy;

said first and second rectangular waveguide passages comprising a rectangular cross section geometry;

a substrate of dielectric material bonded to said upper surface of said base plate and including a first rectangular dielectric region covering an end of said first rectangular waveguide passage and a second rectangular dielectric region covering an end of said second rectangular waveguide passage, said substrate being of a predetermined thickness;

a first metal ring frame attached to said upper surface of said substrate; said first metal ring frame extending about the periphery of said first rectangular dielectric region and containing a passage there through;

a first plurality of electrical vias, said first plurality of electrical vias extending from said first metal ring frame through said substrate for electrical contact with said metal base plate;

a second metal ring frame attached to said upper surface of said substrate; said second metal ring frame extending about the periphery of said second rectangular dielectric region and containing a passage there through;

a second plurality of electrical vias, said second plurality of electrical vias extending from said second metal ring frame through said substrate for electrical contact with said metal base plate;

a first microstrip transmission line and a second microstrip transmission line attached an upper surface of said substrate;

said first microstrip transmission line extending through said passage in said first metal ring frame to said first rectangular dielectric region, said first microstrip transmission line being electrically insulated from said first metal ring frame, and said second microstrip transmission line extending through said passage in said second metal ring frame to said second rectangular dielectric region, said second microstrip transmission line being electrically insulated from said second metal ring frame;

a first coupling probe attached to said upper surface of said substrate; said first coupling probe extending into said first rectangular dielectric region and having an end connected to said first microstrip transmission line for coupling microwave energy to said first microstrip transmission line;

a second coupling probe attached to said upper surface of said substrate; said second coupling probe extending into said second rectangular dielectric region and having an end connected to said second microstrip transmission line for coupling microwave energy to said second microstrip transmission line;

a first metal backshort member for said first rectangular waveguide passage;

said first metal backshort member including an exterior surface containing a rectanguloid shaped portion;

said first metal backshort member further including an interior surface defining a metal walled rectangular microwave cavity having a rectangular cross-section geometry congruent with said cross-section geometry of said first rectangular waveguide passage and having an open front wall;

said first metal backshort member having a bottom end defining a frame to said open front wall of said microwave cavity;

said first metal backshort member further defining a metal walled lateral passage leading from the exterior of said first metal backshort member through said frame and a side wall of said microwave cavity into said microwave cavity, said metal walled lateral passage being oriented perpendicular to said side wall of said microwave cavity and being open on a bottom side;

said first metal backshort member being positioned on said dielectric substrate with said bottom end of said first metal backshort member abutting said first ring frame and said open front wall of said microwave cavity therein oriented facing and in alignment with said first rectangular dielectric region; and with said metal walled lateral passage thereof overlying said passage through said first ring frame;

a first spring means abutting said exterior surface of said first metal backshort member;

a second metal backshort member for said second rectangular waveguide passage;

said second metal backshort member including an exterior surface containing a rectanguloid shaped portion;

said second metal backshort member further including an interior surface defining a metal walled rectangular microwave cavity having a rectangular cross-section geometry congruent with said cross-section geometry of said second rectangular waveguide passage and having an open front wall;

said second metal backshort member having a bottom end defining a frame to said open front wall of said microwave cavity thereof;

said second metal backshort member further defining a metal walled lateral passage leading from the exterior of said second metal backshort member through said frame and a side wall of said microwave cavity thereof into said microwave cavity, said metal walled lateral passage being oriented perpendicular to said side wall of said microwave cavity and being open on a bottom side;

said first metal backshort member being positioned on said dielectric substrate with said bottom end of said backshort abutting said second ring frame and said open front wall of said microwave cavity therein oriented facing and in alignment with said second rectangular dielectric region; and with said metal walled lateral passage thereof overlying said passage through said second ring frame;

a second spring means abutting said exterior surface of said second metal backshort member;

a metal cover plate for attachment to said metal base plate; said metal cover plate including a top side and a bottom side, said cover plate being relatively rigid and having a predetermined thickness;

said bottom side of said cover plate including a peripheral edge portion and bounding a first recessed portion, recessed from said bottom end, to fit over said substrate, wherein said peripheral edge portion contacts said metal base plate and said upper surface of said substrate is received within said recessed portion without contact between said cover plate and said first and second microstrip transmission lines when said cover plate is attached to said metal base plate;

said bottom side of said cover plate including a second recessed area located within said first recessed area for receiving there within said rectanguloid portion of said exterior surface of said first metal backshort member, said second recessed area being further recessed from said bottom than said first recessed area;

said bottom side of said cover plate including a third recessed area located within said first recessed area for receiving there within said rectanguloid portion of said exterior surface of said second metal backshort member, said third recessed area being further recessed from said bottom than said first recessed area;

said cover plate compressing each of said first and second spring means against respectively said first and second metal backshort members to press said first and second metal backshort members against said respective first and second ring frames when said cover plate is fastened to said metal base plate.

5. The invention as defined in claim 4, wherein said substrate further includes a central opening therethrough to provide access to a portion of said upper surface of said metal base plate;

a MMIC amplifier chip, said MMIC amplifier chip being located within said wide central opening and being bonded therewithin to said upper surface of said metal base plate;

said MMIC amplifier chip including an input for receiving microwave energy and an output for outputting amplified microwave energy;

said input being connected to said first microstrip line and said output being connected to said second microstrip line; and wherein said cover plate further comprises:

said first side of said cover plate including another recessed area located within said first recessed area for receiving therewithin said MMIC amplifier chip, said another recessed area being further recessed from said bottom end than said first recessed area.

6. A MMW microwave amplifier module, comprising:

a base plate;

a cover plate for attachment to said base plate in covering relationship therewith;

said base plate including at least a first passage there through defining a waveguide for propagation of microwave energy;

a printed wiring board comprising a dielectric material, said printed wiring board being bonded to said base plate and covering an end of said waveguide;

a backshort member, said backshort member including an internal cavity defining a short circuited waveguide transmission line of a predetermined length, and said short-circuited waveguide transmission line having an open end;

said backshort member being positioned atop said printed wiring board and overlying an end of said waveguide with said open end of said short-circuited waveguide transmission line overlying and aligned with said end of said waveguide;

said printed wiring board including at least a probe and a microstrip transmission line, and said microstrip transmission line being coupled to said probe to couple microwave energy there between;

said microstrip transmission line extending under and through said backshort member;

said probe being located within said open end of said short-circuited waveguide transmission line overlying said end of said waveguide to couple microwave energy between said waveguide and said microstrip transmission line;

a spring member associated with said metal backshort member, said spring member being positioned between said metal cover plate and the exterior surface of said metal backshort member;

said metal cover plate for compressing said spring member against said printed wiring board when said cover plate is attached to said metal base plate, whereby said backshort is held in position pressed against said printed wiring board.

7. The invention as defined in claim 6, wherein each of said cover plate and said base plate are relatively rigid and comprise a metal material.

8. The invention as defined in claim 7, wherein said waveguide comprises a rectangular waveguide; and wherein said short-circuited waveguide transmission line comprises a short-circuited rectangular waveguide transmission line.

9. The invention as defined in claim 8, wherein said predetermined length of said short-circuited rectangular waveguide transmission line comprises one-quarter wavelength at a predetermined frequency, f.

10. The invention as defined in claim 8, wherein said spring member comprises a resilient compressible gasket.

11. The invention as defined in claim 8, wherein said short circuited rectangular waveguide transmission line is of a rectangular cross-section of substantially the same shape as the cross-section of said rectangular waveguide; and, further comprising:

aligning means carried by said metal base for orienting said backshort member relative to said end of rectangular waveguide.

12. The invention as defined in claim 11, wherein said aligning means comprises:

first and second guide pins located on said metal base on opposite sides of said end of said rectangular waveguide and projecting outward from said base plate; and wherein said backshort member includes first and second guide holes for receiving respective ones of said first and second guide pins.

13. The invention as defined in claim 10, wherein said backshort member includes a flange portion, said flange portion being laterally outwardly extending over a portion of said printed wiring board; and wherein said resilient compressible gasket seats on said flange portion.

14. The invention as defined in claim 13, wherein said short circuited rectangular waveguide transmission line is of a rectangular cross-section of substantially the same shape as the cross-section of said rectangular waveguide; and, further comprising:

aligning means carried by said metal base for orienting said backshort member relative to said end of rectangular waveguide.

15. The invention as defined in claim 14, wherein said aligning means comprises:

first and second guide pins located on said metal base on opposite sides of said end of said rectangular waveguide and projecting outward from said base plate; and wherein said backshort member includes first and second guide holes for receiving respective ones of said first and second guide pins.

16. The invention as defined in claim 15, wherein said first and second guide holes in said backshort member are located in said flange portion on opposite sides of said end of said rectangular waveguide.

17. The invention as defined in claim 8, wherein said printed wiring board further comprises:

a metal ring frame and a plurality of electrical vias;

said metal ring frame forming at least a partial loop about said end of said rectangular waveguide and underlying said backshort member, whereby said backshort member abutts said metal ring frame; and said plurality of electrical vias being connected to said metal ring frame for placing said metal ring frame electrically in common with said base plate.

18. The invention as defined in claim 10, wherein said cover plate comprises a bottom surface, said bottom surface including a plurality of internally recessed surface portions, one of said plurality of internally recessed surface portions for exerting a compressing force on said resilient compressible gasket.

19. The invention as defined in claim 16, wherein said printed wiring board further comprises:

a metal ring frame and a plurality of electrical vias;

said metal ring frame forming at least a partial loop about said end of said rectangular waveguide and underlying said backshort member, whereby said backshort member abutts said metal ring frame; and said plurality of electrical vias being connected to said metal ring frame for placing said metal ring frame electrically in common with said base plate.

20. The invention as defined in claim 19, wherein said first guide pin is greater in length than the length of said second guide pin; and wherein said cover plate comprises a bottom surface, said bottom surface including a plurality of internally recessed surface portions, one of said plurality of internally recessed surface portions for exerting a compressing force on said resilient compressible gasket, and a guide hole for receiving said first guide pin.

21. A MMW microwave amplifier module for amplifying microwave energy of frequency F, comprising:

a rigid metal base plate;

a rigid metal cover plate for attachment to said rigid metal base plate in covering relationship therewith;

said rigid metal base plate including at least a first passage there through defining a rectangular waveguide for propagation of microwave energy;

a printed wiring board comprising a dielectric material, said printed wiring board being bonded to said metal base plate and covering an end of said rectangular waveguide;

a metal backshort member, said metal backshort member including an internal cavity defining a short circuited rectangular transmission line of one-quarter wavelength in length at said frequency F, and said short-circuited rectangular waveguide transmission line having an open rectangular end;

said metal backshort member being positioned atop said printed wiring board and overlying an end of said rectangular waveguide with said open rectangular end of said short-circuited rectangular waveguide transmission line overlying and aligned with said end of said rectangular waveguide;

said printed wiring board including at least a probe and a microstrip transmission line, and said microstrip transmission line being coupled to said probe to couple microwave energy there between;

said microstrip transmission line extending under and through said metal backshort member;

said probe being located within said open rectangular end of said short-circuited rectangular waveguide transmission line overlying said end of said rectangular waveguide to couple microwave energy between said rectangular waveguide and said microstrip transmission line;

a spring member associated with said metal backshort member, said spring member being positioned between said metal cover plate and the exterior surface of said metal backshort member;

said rigid metal cover plate for compressing said spring member against said printed wiring board when said cover plate is attached to said metal base plate, whereby said backshort is held in position pressed against said printed wiring board.

22. The invention as defined in claim 21, wherein said spring member comprises a resilient compressible gasket.

23. The invention as defined in claim 22, wherein said backshort member includes a flange portion, said flange portion being laterally outwardly extending over a portion of said printed wiring board; and wherein said resilient compressible gasket seats on said flange portion.

* * * * *